(12) United States Patent
Tschirbs et al.

(10) Patent No.: US 7,763,970 B2
(45) Date of Patent: Jul. 27, 2010

(54) POWER MODULE

(75) Inventors: Roman Tschirbs, Soest (DE); Reinhold Spanke, Bestwig (DE)

(73) Assignee: Infineon Technologies AG, Neubiberg (DE)

( * ) Notice: Subject to any disclaimer, the term of this patent is extended or adjusted under 35 U.S.C. 154(b) by 151 days.

(21) Appl. No.: 12/038,328

(22) Filed: Feb. 27, 2008

(65) Prior Publication Data
US 2009/0213553 A1 Aug. 27, 2009

(51) Int. Cl.
*H01L 23/12* (2006.01)
*H01L 23/053* (2006.01)

(52) U.S. Cl. ............... 257/701; 257/690; 257/E23.003; 257/E23.088; 438/117

(58) Field of Classification Search ......... 257/680, 257/701, E23.003, E23.088; 438/117
See application file for complete search history.

(56) References Cited

U.S. PATENT DOCUMENTS

| | | | | |
|---|---|---|---|---|
| 5,521,437 A | * | 5/1996 | Oshima et al. | 257/701 |
| 5,747,875 A | * | 5/1998 | Oshima | 257/687 |
| 7,099,155 B2 | * | 8/2006 | Kobayashi et al. | 361/719 |
| 2001/0030362 A1 | * | 10/2001 | Grant | 257/712 |
| 2001/0038143 A1 | * | 11/2001 | Sonobe et al. | 257/690 |
| 2006/0284211 A1 | * | 12/2006 | Takubo | 257/177 |
| 2008/0211091 A1 | * | 9/2008 | Kemper et al. | 257/734 |
| 2008/0224303 A1 | * | 9/2008 | Funakoshi et al. | 257/701 |
| 2008/0230905 A1 | * | 9/2008 | Guth et al. | 257/751 |
| 2009/0104734 A1 | * | 4/2009 | Specht et al. | 438/117 |
| 2009/0140414 A1 | * | 6/2009 | Soyano et al. | 257/698 |
| 2009/0206456 A1 | * | 8/2009 | Guth et al. | 257/666 |

FOREIGN PATENT DOCUMENTS

| | | |
|---|---|---|
| DE | 10047146 A1 | 4/2002 |
| DE | 10142971 A1 | 3/2003 |
| DE | 10149886 A1 | 4/2003 |
| DE | 10326176 A1 | 1/2005 |

* cited by examiner

*Primary Examiner*—Fernando L Toledo
(74) *Attorney, Agent, or Firm*—Coats & Bennett, P.L.L.C.

(57) ABSTRACT

A power semiconductor module comprises a housing. The housing comprises a casing and at least one coating of high resistance to surface tracking. A plurality of electrical conductors is provided on the housing. The coating is provided on a creepage distance that is provided between the electrical conductors.

23 Claims, 8 Drawing Sheets

POWER MODULE

TECHNICAL FIELD

This invention relates to a power module.

BACKGROUND

The spacing between conductive parts is important for designing electrical equipment. The spacing is designed to be sufficiently wide to avoid an electrical breakdown between conductive parts to be insulated from each other, especially in a high voltage environment. The required spacing between the conductive parts for insulation is dependent on pollution level of the environment which surrounds the conductive parts, distances of the conductive parts to other conductive parts, working voltage of the equipment, and comparative tracking index or resistance to surface tracking of material used in the equipment.

The spacing can be characterized by clearance and creepage distance according to IEC 60664. The clearance is generally defined as the shortest distance between two conductive parts measured through air. The creepage distance is generally defined as the shortest path between two conductive parts measured along a surface of insulation. The comparative tracking index (CTI) of a material is a measure of a resistance of the insulator to surface tracking, which is an electrical breakdown on the surface of the material.

SUMMARY

A power semiconductor module comprising a housing is disclosed herein wherein the housing comprises a casing and at least one coating of high resistance to surface tracking; and a plurality of electrical conductors being provided on the housing, the coating being provided on a creepage distance between the electrical conductors.

Further, a method to produce a power semiconductor module is disclosed. The method comprises providing a housing. A plurality of electrical conductors is provided on the housing. At least one coating of high resistance to surface tracking is provided on a creepage distance between the electrical conductors.

In another embodiment, a method to produce a power semiconductor module comprises providing a housing. A plurality of electrical conductors is provided on the housing. The housing is partly covered with a coating susceptible to surface tracking on a creepage distance between the electrical conductors.

Of course, the present invention is not limited to the above features and advantages. Those skilled in the art will recognize additional features and advantages upon reading the following detailed description, and upon viewing the accompanying drawings.

BRIEF DESCRIPTION OF THE FIGURES

The novel power module can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
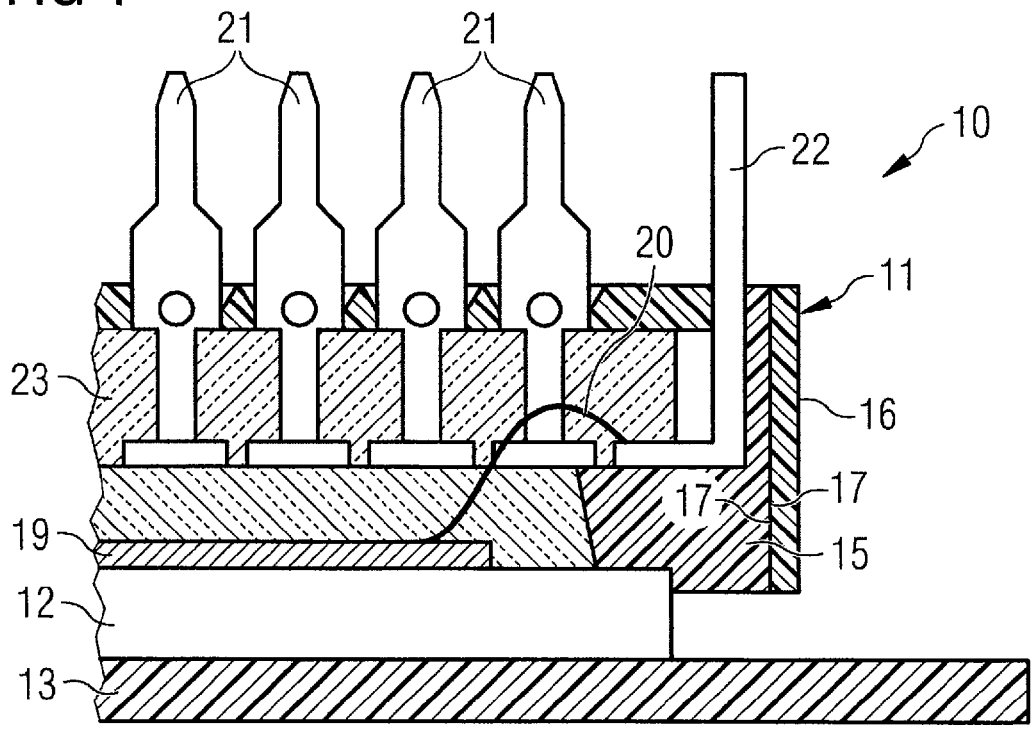
FIG. 1 is a partial cross sectional view of a first novel power module.

FIG. 1 shows partially a cross section of a first novel power module 10. The power module 10 comprises a housing 11 and a base plate 12 and is mounted on a heat sink 13 not comprised by the module 10. The housing 11 is arranged on a first surface of the base plate 12. The heat sink 13 is arranged on a second surface of the base plate 12 wherein the second surface of the base plate 12 is opposite to the first surface of the base plate 12. The housing 11 includes a plurality of walls 15 and a coating 16. The coating 16 is arranged adjacent to and in contact with an exterior surface 17 of the walls 15.

The walls 15 form an enclosure, which surrounds a substrate 19, a plurality of wires 20, a plurality of main high voltage contacts or main contacts 21, a plurality of auxiliary contacts 22, and an encapsulating compound 23. Compound 23 may be resin or a silicon gel. The substrate 19 is attached to the base plate 12. The plurality of the main contacts 21 is placed above the substrate 19 and in a central portion of the housing 11. The plurality of auxiliary contacts 22 is arranged on the substrate 19 in an outer portion of the housing 11. It is also possible arrange the main contacts 21 in an outer portion of the housing 11 and the auxiliary contacts 22 in a central portion of the housing 11. The wires 20 are attached between the auxiliary contacts 22 and the substrate 19. The encapsulating compound 23 fills an interior of the housing 11 and covers the substrate 19, the plurality of wires 20, a spatial part of each of the plurality of main contacts 21 and a spatial part of each of the plurality of auxiliary contacts 22. The coating 16 is provided on a creepage distance that is routed between the auxiliary contact 22 and the heat sink 13 and the auxiliary contact 22 and the base plate 12.

The main contacts 21, the auxiliary contacts 22, and the heat sink 13 are electrical terminals in a form of electrical conductors. The walls 15 form a casing. The casing and the coating 16 form the housing 11.

FIG. 1 shows the housing 11, which includes the walls 15 and the coating 16. The coating 16 may comprise equal properties compared to the properties of the walls 15. Other properties of the coating 16 may differ from that of the walls 15. The coating 16 includes a shielding material of high resistance to surface tracking or electrical breakdown. The coating 16 of high resistance to surface tracking may be a thin film, a stand-alone layer or a lacquer coating.

The walls 15 comprise a wall material of thermal and electrical insulation. The electrical insulating property of the walls 15 shields the user from electrical voltage within the housing 11. Moreover, the wall material may also be compatible with other materials of the housing 11 such as a sealing compound 23. Moisture absorption rate of the wall material may be less than 1 percent. Moisture that is absorbed by the wall material may cause a sealing compound that is attached to the wall material to be separated from the wall material when the moisture evaporates and leaves the wall material. Furthermore, the wall material may be of a pre-determined firmness that provides mechanical structure for the housing 11.

It is possible that the wall and shielding materials are not easily combustible and are easy to produce. Moreover, the wall and shielding materials may be able to withstand temperatures in the range between 50 degrees Celsius (C) and 200 degrees Celsius (C). A luminance of surfaces of the wall and shielding materials may permit easy marking of the wall 15 and the coating 16 by laser.

The heat sink 13, as shown in FIG. 1, dissipates heat that is generated within the housing 11 and provides an electrical ground. The base plate 12 mechanically supports the substrate 19 and transfers heat generated within the housing 11 to the heat sink 13. The substrate 19 comprises an electrically insulating material and forms a base for attachment of power semiconductor chips and other electrical equipment.

The main contacts 21, as provided here, are terminals to receive or send electrical signals of peak voltage. The peak voltage may rise to values of more than 6500 volts. The auxiliary contacts 22 are terminals to receive or send electrical signals of smaller peak voltages than that send or received by the main contacts 21. The peak voltage transferred by the auxiliary contacts 22 may range between −20 V and +20 volts. The main contacts 21 and the auxiliary contacts 22 may be connected to an external electrical circuitry and an internal electrical circuitry being located on the substrate 19. The wires 20 transfer electrical signals between the substrate 19 and the auxiliary contacts 22. The encapsulating compound 23 shields parts within the housing 11 from the environment surrounding the power module 10. The power module 10 comprises at least one power semiconductor chip to operate at high voltage levels. The power module 10 is a so-called power semiconductor module.

A first exemplary method to produce the first power module 10 comprises the provision of a substrate 19. The substrate 19 is disposed on the base plate 12. Then, the walls 15 are mounted on the top surface of the base plate 12. The wires 20, the main contacts 21 and the auxiliary contacts 22 are subsequently attached to a top surface of the substrate 19. The coating 16 is then attached to the exterior surface 17 of the wall 15. The step of attaching the coating 16 onto the wall 15 following the step of assembling the parts within the housing 11 allows the provision of the coating 16 to an assembled housing 11.

A second method to produce the first power module 10 includes providing of the walls 15. The coating 16 is then attached to the exterior surface 17 of the wall 15. The substrate 19 is subsequently placed on the base plate 12. The walls 15 are mounted on the top surface of the base plate 12. Then, the wires 20, the main contacts 21, and the auxiliary contacts 22 are attached to a top surface of the substrate 19. The step of assembling the parts within the housing 11 following the step of attaching the coating 16 to the wall 5 avoids the possibility of damaging the assembled housing 11 during the step of attaching the coating 16 onto the wall 15.

The coating 16 may be formed by means of moulding. The moulding process may be a plastics injection moulding process. Following this step, the walls 15 may be provided at an inner surface of the coating 16.

The example of a novel power module shown in FIG. 1 provides a creepage distance that is routed between the contacts 21, 22 and the heat sink 13 or the base plate 12 with the coating 11 of high resistance to surface tracking. The coating 11 increases the resistance of the creepage distance to surface tracking.

In the power module 10, signals of high peak voltages are transferred to the main contacts 21. The heat sink 13 or the base plate 12 may be electrically grounded. In this case, a large electrical potential difference occurs between the main contacts 21 and the heat sink 13 or the base plate 12. The large electrical potential difference stresses the components between the main contacts 21 and the heat sink 13 or the base plate 12 and may cause an electrical breakdown of the components and form an electrical current leakage path between the main contacts 21 and the heat sink 13 or the base plate 12. The electrical current leakage path may be arranged along the shortest surface path between the main contact 21 and the heat sink 13 or the base plate 12, which is the creepage distance. The coating 16 of high resistance to surface tracking arranged on the creepage distance advantageously increases the resistance of the creepage distance to surface tracking not only for the auxiliary contact 22 but for the main contacts 21 and thus for the power module 10.

The coating 16 and the walls 15 advantageously provide the housing 11. The coating 16 provides the property of high resistance to surface tracking to the housing 11. The walls 15 may provide the properties of electrical insulation, low moisture absorption, firmness and mechanical structure to the housing 11. It is easier to source for one material providing the properties of the coating 16 and a second material providing the properties of the walls 15 than a single material showing the properties of the coating 16 and of the walls 15.

Figure 2:
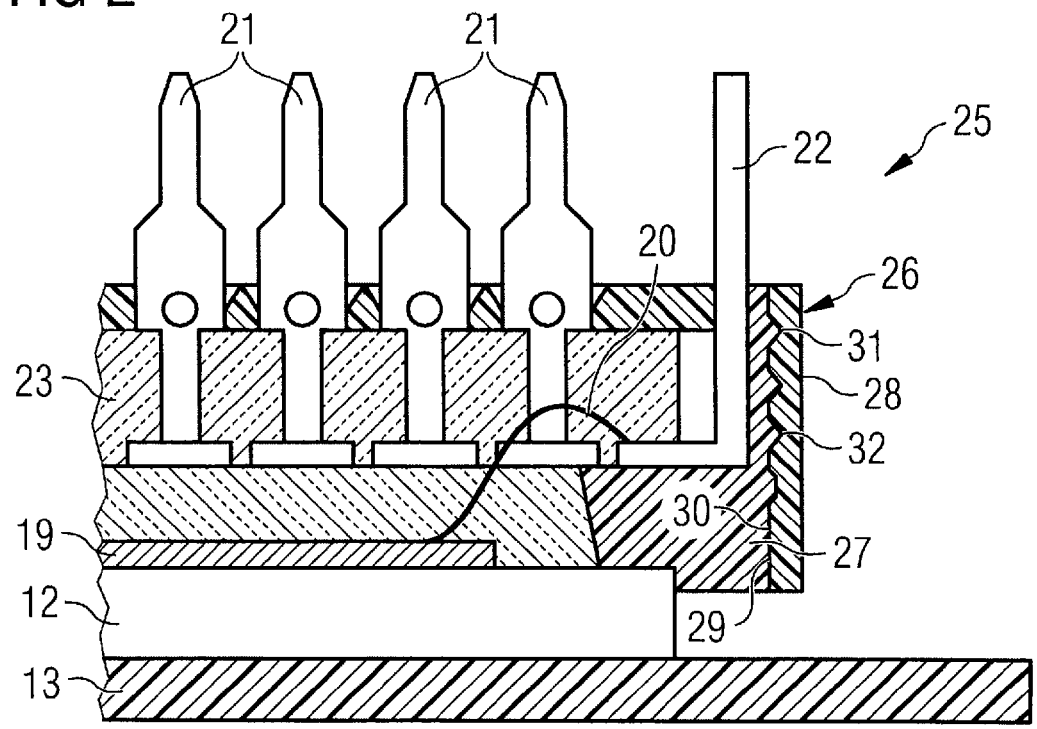
FIG. 2 is a partial cross sectional view of a second novel power module.

FIG. 2 shows a partial cross section of a second novel power module 25. The power module 25 includes a housing 26 and a base plate 12. The housing 26 is provided on the base plate 12 and the base plate 12 is arranged subsequently on a heat sink 13.

The housing 26 comprises a wall 27 and a coating 28. A plurality of layer grooves 32 is provided on a contact surface 30 of the coating 28. A plurality of wall grooves 31 is provided on an exterior surface 29 of the wall 27. The wall grooves 31 of the second wall 27 are interlocked with the layer grooves 32 of the coating 28. The walls 27 enclose the plurality of main contacts 21, the plurality of auxiliary contacts 22, the plurality of wires 20, the substrate 19, and the encapsulating compound 23. The coating 28 is provided on a creepage distance that is routed between the main contacts 21 and the heat sink 13 or the base plate 12 and between the auxiliary contact 22 and the heat sink 13 or the base plate 12.

The layer grooves 32 form a firm contact with the wall grooves 31. The firm contact thereby fixes the coating 28 onto the wall 27 and keeps the coating 28 from shifting. A loose connection between the second wall 27 and the second coating 28 may detrimentally allow a creepage distance that is routed between the main contacts 21 and the heat sink 13 or the base plate 12, to be formed on a surface between the wall 27 and the coating 28.

Figure 3:
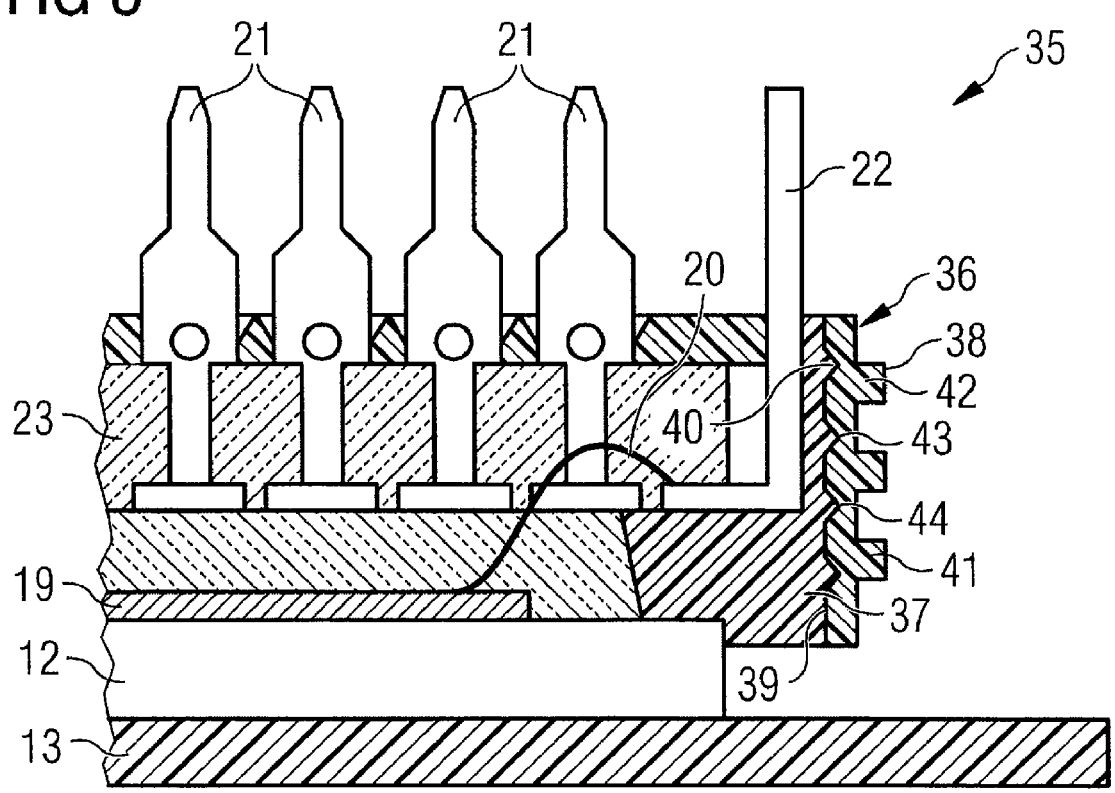
FIG. 3 is a partial cross sectional view of a third novel power module.

FIG. 3 shows a partial cross section of a third novel power module 35. The power module 35 includes a housing 36 and a base plate 12. The housing 36 is placed on the base plate 12 whereas the base plate 12 is attached subsequently to a heat sink 13.

The housing 36 includes a wall 37 and a coating 38. The wall 37 comprises an exterior surface 39. A plurality of wall grooves 43 is provided on the exterior surface 39. The coating 38 includes outer surface 42 and inner surface 40 that is opposite the outer surface 42. A plurality of layer grooves 44 is provided on the inner surface 40 and a plurality of protrusions 41 is provided on the outer surface 42. The wall grooves 43 are interlocked with the layer grooves 44. The wall 37 encloses the main contacts 21, the auxiliary contacts 22, the wires 20, the substrate 19, and the encapsulating compound 23. The coating 38 is provided on a creepage distance that is routed between the main contact 21 and the heat sink 13 or the base plate 12 and between the auxiliary contact 22 and the heat sink 13 or the base plate 12.

The protrusions 41 of the coating 38 advantageously increase the creepage distance that is routed between the auxiliary contact 22 and the heat sink 13 or the base plate 12. The creepage distance is increased without an increase of the external dimensions of the power module 35. The increased creepage distance increases the resistance of the creepage distance to surface tracking. The wall grooves 43 and the layer grooves 44 fix the coating 38 onto the wall 37 and prevent the coating 38 from shifting. A loose connection between the wall 37 and the coating 38 may detrimentally allow a creepage distance that is routed between the main contact 21 and the heat sink 13 or the base plate 12 to be formed on a surface between the wall 37 and the coating 38.

Figure 4:
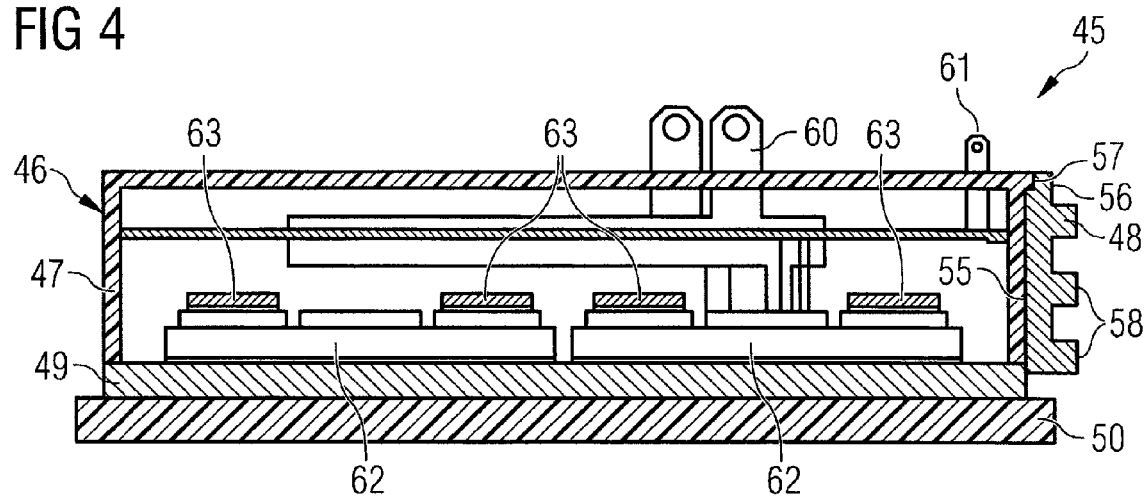
FIG. 4 is a cross sectional view of a fourth novel power module.

FIG. 4 shows a cross section of a fourth novel power module 45. The power module 45 comprises a housing 46 and a base plate 49. The housing 46 is mounted on the base plate 49 and the base plate 49 is attached subsequently to a heat sink 50. The housing 46 includes a plurality of walls 47 and a coating 48. The housing 46 is a kind of a casing. The wall 47 has an exterior surface. The coating 48 has an inner surface 55 and an outer surface 56. The inner surface 55 of the coating 48 is located adjacent to the exterior surface 57 of the wall 47. Alternatively to the coating 48 being in contact or bonded to the external surface 57 of the housing 46, the coating may be located adjacent to an internal surface of the wall 47. A plurality of protrusions 58 is provided on the outer surface 56 of the coating 48. The walls 47 comprise an insulating material while the coating 48 comprises a material of high resistance to surface tracking.

The plurality of walls 47 forms an enclosure that surrounds a plurality of main contacts 60, a plurality of auxiliary contacts 61, a plurality of substrates 62, and a plurality of power semiconductor chips 63. The substrate 62 is disposed above and adjacent to the base plate 49. A power semiconductor chip 63 is provided above and in contact with the substrate 62. The main contacts 60 and the auxiliary contacts 61 are provided above the substrates 62.

Figure 5:
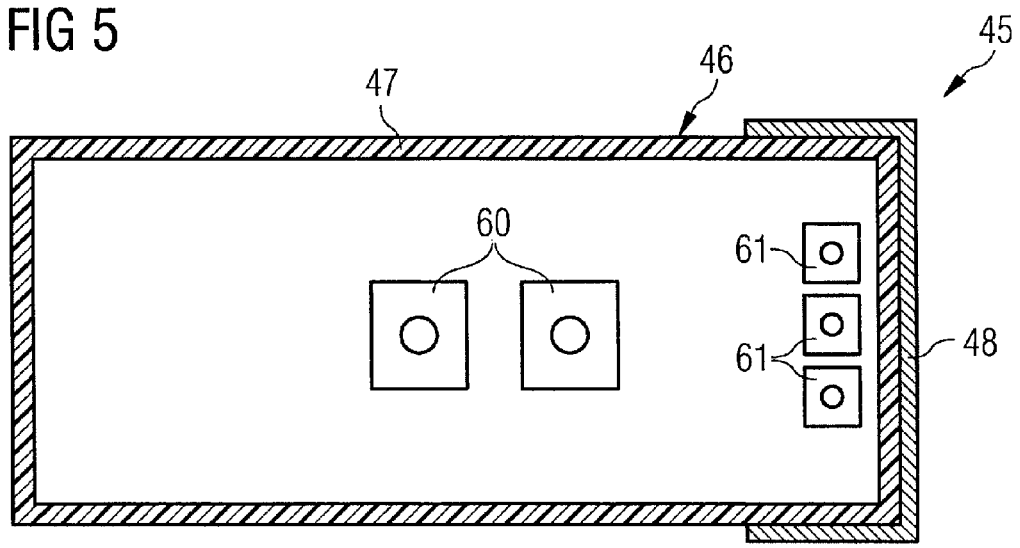
FIG. 5 is a top view of the power module shown in FIG. 4.

Referring to FIG. 5 which shows a top view of the module shown in FIG. 4, the main contacts 60 are provided in a central portion of the surface of the enclosure being parallel to a surface of the base plate 49. The auxiliary contacts 61 are located in an outer portion of the surface of the enclosure being parallel to a surface of the base plate 49 and are partially surrounded by the coating 48.

The semiconductor chip 63 may be in a form of an analogue semiconductor chip, a digital semiconductor chip or a mixed signal semiconductor chip. In another example, the semiconductor chip may be a passive component such as a resistor. The power semiconductor 63 is able to operate at high voltages. The power module 45 or power semiconductor module comprises power semiconductor chip 63 within the housing 46.

The power module 45 comprises a creepage distance CD1 (not shown) that is located between the auxiliary contact 61 and the base plate 49 and a creepage distance CD2 (not shown) that is located between the main contact 60 and the base plate 49. The coating 48 is selectively arranged on the creepage distance CD1, instead of the creepage distance CD2. The tendency of a creepage distance to suffer from electrical breakdown is dependent on the amount of voltage applied to electrical conductors that are located on the ends of the creepage distance, the creepage distance, and the resistance to surface tracking of the creepage distance. The coating 48 is selectively placed on a creepage distance that is more susceptible or likely to suffer from electrical breakdown during application. As shown in FIG. 5, the coating 48 only partially covers the housing 46.

Figure 6:
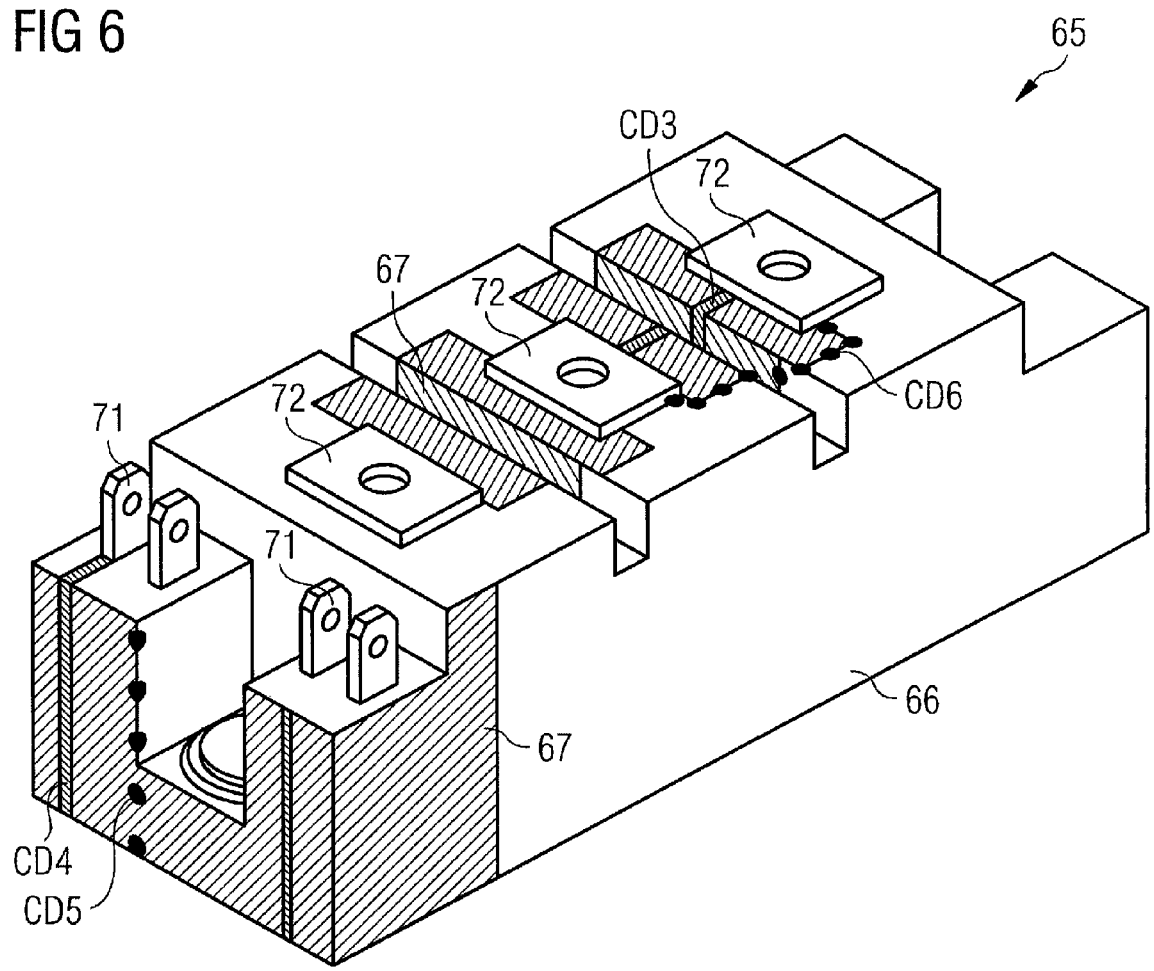
FIG. 6 is an isometric view of a fifth novel power module.

FIG. 6 is an isometric view of a fifth exemplary power module 65. The power module 65 comprises a cover 66 and a plurality of coatings 67. The coating 67 is placed adjacent to the cover 66. The cover 66 comprises a electrically insulating material while the coating 67 comprises a material of high resistance to surface tracking. A plurality of plug contacts 71 and a plurality of screw contacts 72 are provided on the cover 66. The coating 67 is placed between the screw contact 72 and the adjacent screw contact 72. The coating 67 is also placed between the plug contacts 71 and the adjacent plug contacts 71.

The FIG. 6 shows a creepage distance CD3 between the screw contact 72 and the adjacent screw contact 72 and a creepage distance CD4 between the plug contact 71 and another electrical conductor such as the base plate shown in FIG. 4 and FIG. 5 located underneath the power module 65. The creepage distance CD3 is placed on the coating 67 while the creepage distance CD4 is arranged on the coating 67.

The FIG. 6 also shows an alternate current path CD5 (dotted line) between the plug contact 71 and another electrical conductor located underneath the power module 65, and an alternate electrical current leakage path CD6 (dotted line) between the screw contact 72 and the adjacent screw contact 72. The alternate current path CD5 comprises a path on the cover 66 and a path on the coating 67 while the alternate electrical current leakage current path CD6 includes a path on the cover 66. An electrical current leakage current may travel on the alternate leakage paths CD5 and CD6 instead of travelling on the creepage distance CD3 and CD4 because of the high resistance to surface tracking provided by the fifth coating 67. The paths CD5 and CD6 are longer in distance compared to paths CD3 and CD4 to provide an equivalent resistance to surface tracking.

The plug contact 71 and the screw contact 72 are electrical conductors. The cover 66 is a kind of a casing. The plug contacts 71 and the screw contacts 72 are used for connection to an external power source or external load. The cover 66 insulates electrical circuitry within the power module 65 from the environment of the power module 65. The coating 67 provides a high resistance to surface tracking of a creepage distance that is placed on the coating 67.

The exemplary module of FIG. 6 exhibits a provision of the coating 67 between electrical conductors to increase the resistance to surface tracking of a creepage distance that is placed between the electrical conductors.

Figure 7:
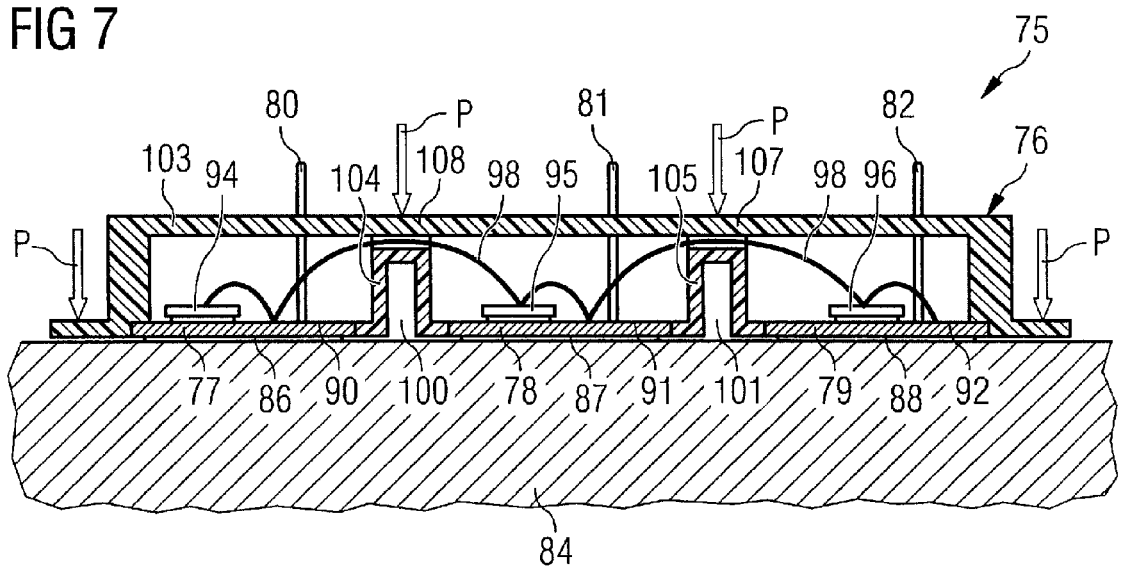
FIG. 7 is cross sectional view of a sixth novel power module.

FIG. 7 shows a cross section of a sixth exemplary power module 75 without a base plate. The power module 75 comprises a housing 76, a plurality of substrates 77, 78, and 79, and a plurality of contact pins 80, 81, and 82, and is subsequently mounted to a heat sink 84. The housing 76 is arranged over the substrates 77, 78, and 78 and the substrates 77, 78, and 79 are located on the heat sink 84. The plurality of contact pins 81, 81, and 82 extends from the substrates 77, 78, and 79.

The substrate 78 is separated from the adjacent substrates 77 and 79 by slots 100 and 101, respectively. The substrates 77 and 79 include bottom surfaces 86, 87, and 88, and top surfaces 90, 91, and 92, respectively. The bottom surfaces 86, 87, and 88 are attached subsequently to the heat sink 84 by a thermally conductive paste.

A plurality of semiconductor chips 94, 95 and 96 is arranged on the top surfaces 90, 91, and 92, respectively. The semiconductor chips 94, 95, and 96 are attached to the substrates 77, 78, 79 by a plurality of conductive paths disposed on the top surfaces 90, 91, and 92. A plurality of bonding wires 98 is electrically connected between the semiconductor chip 95 and adjacent semiconductor chips 94 and 96, and between the semiconductor chips 94, 95, and 96 and the conductive paths. The housing 76 comprises a cover 103 and a plurality of stamps 104 and 105. FIG. 7 shows the housing 76 closed with respect to its environment wherein the stamps 104 and 105 are located below the cover 103. The cover 103 encloses the stamps 104 and 105, the substrates 77, 78, and 79, and the semiconductor chips 94, 95, and 96.

The cover 103 comprises access regions 107 and 108 on its top surface. The stamps 104 and 105 extend between the cover 103 and the heat sink 84 and are in contact with the cover 103 and the heat sink 84. Bottom portions of the stamps 104 and 105 are placed in slots 100 and 101 which are provided between semiconductor chips 94 and 95 and between semiconductor chips 95 and 96. The contact pins 80, 81 and 82 are electrically connected to the conductive paths, which are provided on the substrates 77, 78, and 79. The contact pins 80, 82, and 83 extend from an interior of the housing 76 to an exterior of the housing 76. A creepage distance between the contact pins 80, 81 and 82 and the heat sink 84 is formed on the cover 103.

The cover 103 is a form of a coating. The semiconductor chips 94, 95, and 96 may be power semiconductors. The power module 75 is closed with respect to its environment. The cover 103 and the stamps 104 and 105 comprise a resilient material, which is elastic and mechanically compatible with the substrates 77, 78 and 79. The cover 103 comprises a shielding material of high resistance to surface tracking while the stamps 104 and 105 include an electrically insulating material. The cover 103 and stamps 104 and 105 may be produced using plastics injection-moulding. The creepage distances between the contact pins 80, 81, and 82 and the heat sink 84 are formed on the cover 103. The formation of creepage distances on the cover 103 is advantageous, as the cover 103 comprises a material of high resistance to surface tracking.

The access regions 107 and 108 are for application of mechanical pressure P as shown in FIG. 7. External clips or screw connections may apply the mechanical pressure P, which is then transmitted via the substrates 17, 18, 19 to the heat sink 84 by the stamps 104 and 105. The semiconductor chips 94, 95 and 96 generate heat when operated. The heat sink 84 dissipates the heat generated by the operational semiconductor chips 94, 95 and 96. The pressure P ensures a good thermal contact to the heat sink 84.

Figure 8:
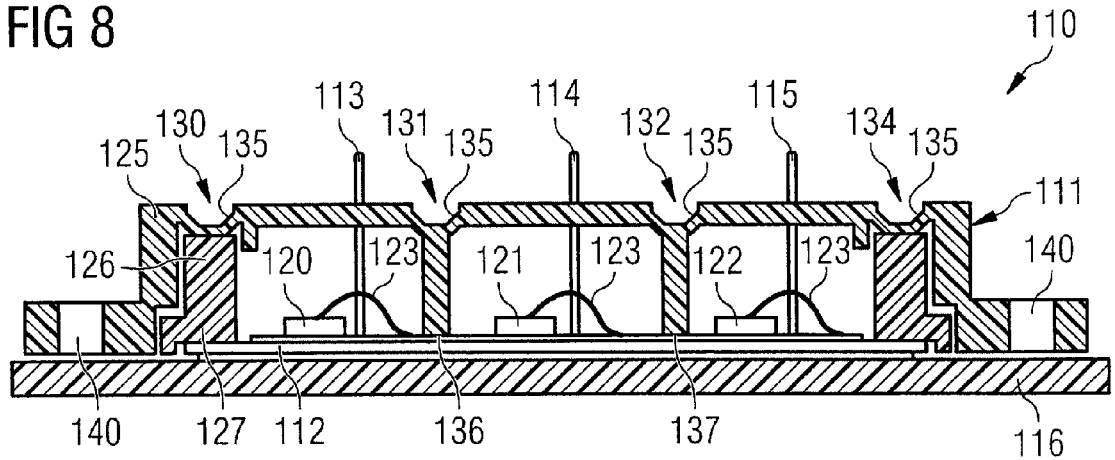
FIG. 8 is cross sectional view of a seventh novel power module.

A cross sectional view of a seventh novel power module 110 is shown in FIG. 8. The power module 110 is in an assembled state or closed with respect to its environment, as shown in FIG. 8. The power module 110 comprises a housing 111, a substrate 112, and a plurality of contact pins 113, 114, and 115. The housing 111 is arranged over the substrate 112 and the substrate 112 is attached subsequently to a heat sink 116. Contact pins 113, 114, and 115 are arranged on the substrate 112.

A plurality of semiconductor chips 120, 121, and 122 is arranged on the substrate 112 and is electrically connected with the substrate 112. The semiconductor chips 120, 121, and 122 are connected via a plurality of bonding wires 123 to a plurality of conductor paths formed on a surface of the substrate 112. The housing 111 is formed from an outer housing part 125 and an inner housing part 126 wherein the outer housing part 125 clasps the inner housing part 126.

The inner housing part 126 is provided with a collar 127, which is located on an outer area of the substrate 112 with respect to a center of the substrate 112. The outer housing part 125 comprises a plurality of holes 140 and a plurality of resilient areas 130, 131, 132 and 133, which are integrally formed on the outer housing part 125. The holes 140 are located on an outer portion of the outer housing part 125. The resilient areas 130, 131, 132 and 133 are formed by a plurality of elastic strips 135. Other forms and shapes of the resilient areas 130, 131, 132 and 133 are possible. The elastic strips are arranged to a form a plurality of webs. The resilient areas 131 and 132 are integrally connected to vertical stamps 136 and 137 via the elastic strips 135. Ends of the stamps 136 and 137 are in contact with an upper surface of the substrate 112, as shown in the FIG. 8. The resilient areas 130 and 134 are connected to the outer area of the substrate 112 by the collar 127.

Conductor paths (not shown) are electrically connected to the contact pins 113, 114, and 115, which extend from the conductor tracks to an exterior of the housing 111. Creepage distances between the contact pins 113, 114, and 115, and the heat sink 116 are formed on the outer housing part 125.

The inner housing part 126 is made from a material, which is thermally and mechanically compatible with the substrate 112. It is not necessary that the inner housing part 126 and the outer housing part 125 are mechanically interconnected for example by an adhesive. They may be in loose contact to each other. One possible way to provide an inner housing part 126 which is interconnected with the outer housing part 125 is by providing one part in a pre-moulded state and by moulding the other part directly on the pre-moulded part, thereby providing a bonding between the two parts 125, 126.

The outer housing part 125 is a form of a cover. The outer housing part 125 comprises a material of high resistance to surface tracking. This is advantageous in that the creepage distances between the contact pins 113, 114, and 115, and the heat sink 116 are formed on the outer housing part 125, which has high resistance to surface tracking.

The outer housing part 125 is pressed onto the heat sink 116 when the power module 110 is secured to the heat sink 116. The pressing force may originate from mounting screws or external clips. The pressing, in turn, causes the collar 127 and the stamps 136 and 137 to press the substrate 112 onto the heat sink 116.

The holes 140 are for insertion of mounting screws for fixing the power module 110 to the heat sink 116. The contact pins 113, 114 and 115 are for external connections of the power module 110. The resilient areas 130, 131, 132 and 133 may be produced by providing material cut-outs in a region of the resilient areas 130, 131, 132 and 133 as shown in FIG. 8.

Figure 9:
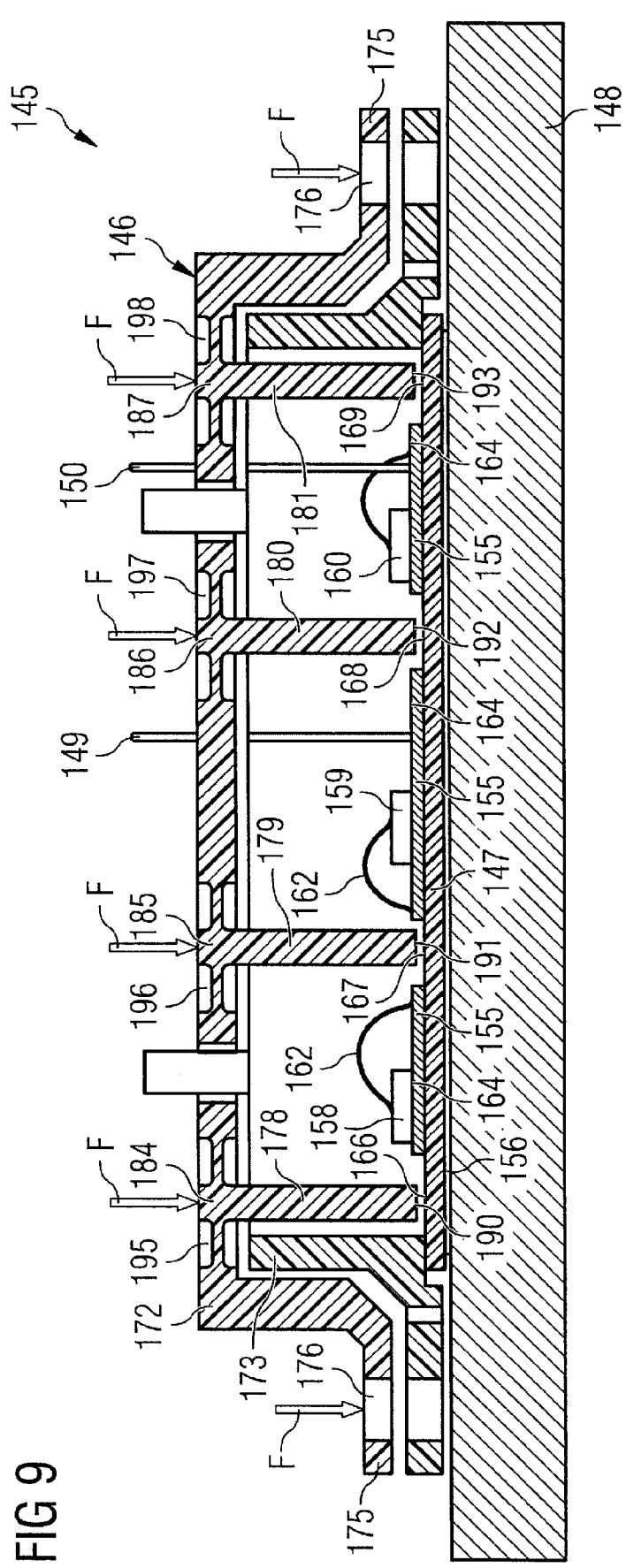
FIG. 9 is cross sectional view of a eighth novel power module.

A cross sectional view of an eighth novel power module 145 is shown in FIG. 9. The power module 145, shown in FIG. 9 without a base plate, comprises a housing 146, a substrate 147, and a plurality of contact pins 149 and 150. The housing 146 encloses the substrate 147, and the substrate 147 is mounted on a heat sink 148. The contact pins 149 and 150 are arranged on the substrate 147.

A substrate 147 is coated with a top layer 155 of copper and a bottom layer 156 of copper. A plurality of semiconductor chips 158, 159, and 160 is arranged on the top layer 155 and is connected, by bonding wires 162, to conductive paths 164, which are formed in the coating of top layer 155. The semiconductor chips 158, 159, and 160 are separated by slots or contact pressure locations 166, 167, 168, and 169, which are provided at pre-defined substrate locations. The bottom layer 156 is connected subsequently to the heat sink 148.

The housing 146, as shown in FIG. 9, is closed with respect to its environment and it encloses the substrate 147 and the semiconductor chips 158, 159, and 160. The housing 146 comprises an outer housing part 172 and an inner housing part 173. The outer housing part 172 encloses the inner housing part 173.

The outer housing part 172 includes lateral flanges 175 at its outer area. The lateral flanges 175 comprise holes 176. A plurality of stamps 178 is integrally formed on the outer housing part 172 such that first ends 184, 185, 186, and 187 of the stamps 178, 179, 180, and 181, respectively, are connected to the outer housing part 172. Second ends 190, 191, 192, and 193 of the stamp 178, 179, 180, and 181 are in contact with the substrate 147. The first ends 184, 185, 186, and 187 are connected to the outer housing part 172 via resilient areas 195, 196, 197, 198, which may have a thinned section of material or material recesses. A force F is applied on the outer housing part 172 to press the outer housing part 172 onto the heat sink 148. The force F is transmitted by stamps 178, 179, 180, and 181 to the substrate 147.

The inner housing part 173 is tightly bonded to the top layer 155 of the substrate 147 to form an enclosure of the substrate 147 and the components arranged thereon. A soft encapsulating compound may be filled into the enclosure to cover the semiconductor chips 158, 159, and 160, the bonding wires 162 and the substrate 147. The contacts pins 149 and 150 are connected to the conductive tracks 164 and they extend from the substrate 147 to an exterior of the housing 712, 173. Creepage distances between the contact pins 149 and 150 and the heat sink 148, and between the contact pins 149 and 150 are formed on the outer housing part 172.

The outer housing part 172 is a form of a cover while the inner housing part 173 is a form of a wall. The heat sink 148 is a form of a cooling element. The lateral flange 175 is a form of a collar. The stamps 178, 179, 180 and 181 are a form of a contact pressure element. The stamps 178, 179, 180 and 181 may be provided with springs or be provided by a spring elastic design.

The outer housing part 172 comprises a material of high resistance to surface tracking. This benefits the power module 145 in that the creepage distances between the contact pins 149 and 150, and the heat sink 148, and between the contacts pins 149 and 150 are routed on the outer housing part 172, which has a high resistance to surface tracking.

The inner housing part 173 shields the environment of the power module 145 a user from the operated power module 145 and comprises a material which is mechanically and chemically compatible with the substrate 147 and the semiconductor chips 158, 159, and 160. The holes 176 are for screw or external clip connection to the heat sink 148. The stamps 178, 179, 180 and 181 presses the substrate 147 onto the heat sink 148 in a resilient manner.

Figure 10:
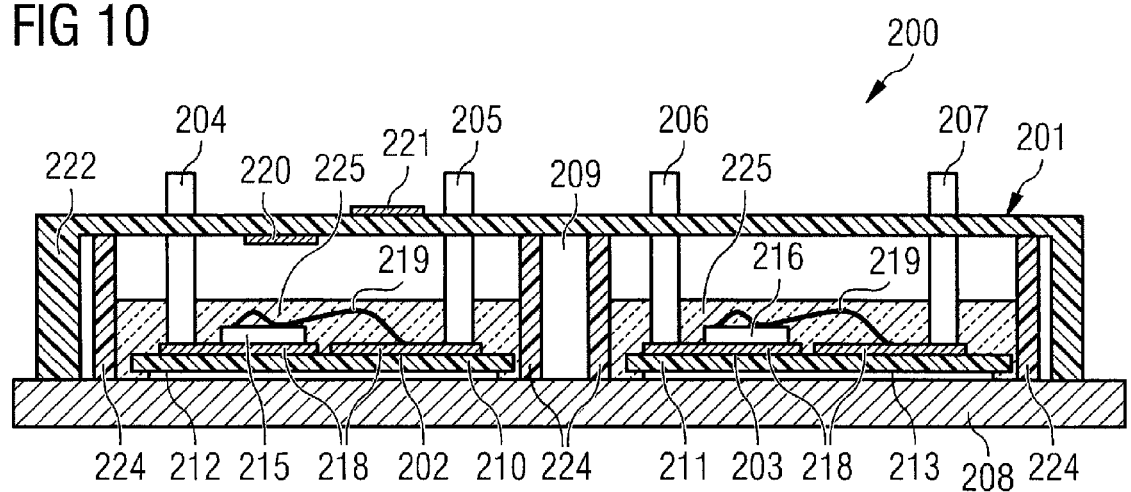
FIG. 10 is cross sectional view of a ninth novel power module.

FIG. 10 shows a cross section of a ninth novel power module 200. The power module 200 comprises a housing 201, a plurality of substrates 202 and 203, a plurality of contact pins 204, 205, 206, and 207, and a base plate 208. The housing 201 is provided above the plurality of substrates 202 and 203, whereas the plurality of substrates 202 and 203 is located on the base plate 208. The plurality of contact pins 204, 205, 206, and 207 extends from the substrates 202 and 203 to the exterior of the power module 200.

The substrate 202 is separated from the adjacent substrate 203 by a gap 209. The substrates 202 and 203 comprise top surfaces 210 and 211, and bottom surfaces 212 and 213. The bottom surfaces 212 and 213 are attached to the base plate 208 via a thermally conductive glue. Semiconductor chips 215 and 216 are provided on the top surfaces 210, 211. The semiconductor chips 215 and 216 are attached to the substrates 202 and 203 by a plurality of conductive paths 218 that are disposed on the top surfaces 210 and 211. A plurality of bonding wires 219 is electrically attached between the semiconductor chips 215 and 216 and the conductive tracks 218.

FIG. 10 shows the housing 201 closed with respect to its environment. The housing 201 comprises a cover 222 and a plurality of walls 224. The cover 222 is a casing and encloses the walls 224, the substrates 202 and 203, and the semiconductor chips 215 and 216.

Lower ends of the walls 224 with respect to the base plate 208 are bonded to the base plate 208 and upper ends of the walls 224 are in contact with the cover 222. A plurality of walls 224 located between a top side of the cover 222 and the base plate 208 forms an enclosure around the substrate 201 and semiconductor chip 215, and another enclosure around the substrate 202 and semiconductor chip 216.

The plurality of contact pins 204, 205, 206, and 207 is disposed on the substrates 202 and 203, and is electrically attached to the conductive paths 218. First ends of the contact pins 204, 205, 206, and 207 are attached to the substrates 202 and 203 and second ends of the contact pins 204, 205, 206, and 207 extend to the exterior of the cover 222. Creepage distances between the contact pins 204, 205, 206, and 207, and between the contact pins 204, 205, 206, and 207 and the heat sink 208 are formed on the cover 222. The enclosures are filled by an encapsulating and insulating compound 225 which covers the semiconductor chips 215 and 216, the substrates 202 and 203 and the bonding wires 219.

The cover 222 is a form of a protective coating. The power module 200 is closed with respect to its environment. The walls 224 comprise materials, which are elastic and thermally insulating and mechanically compatible with the base plate 208 and the substrate 202 and 203. The cover 222 comprises a shielding material of high resistance to surface tracking. The creepage distances between the contact pins 204, 205, 206, and 207 and the heat sink 208 and between the contact pins 204, 205, 206, and 207 are formed on the cover 222. The formation of creepage distances on the cover 222 is advantageous in that the cover 222 comprises a material of high resistance to surface tracking.

External clips may be applied onto the cover 222 to press the cover 222 onto the base plate 208. The semiconductor chips 215 and 216 generate heat when operated. The base plate 208 dissipates the heat generated by the operated semiconductor chips 215 and 216 to a heat sink (not shown in FIG. 10).

Layers 220, 221 are attached to the cover 222. The layers 220, 221 are chemically inert with respect to ambient materials. Chemically inert comprises that there is no chemical interaction between the layer and the ambient material. It is understood that a chemical interaction comprises a travel of ions from the layer to the vicinity of the ambient material or onto the surface the ambient material. The layer 220 is attached to an internal surface of the cover 222 and chemically inert with respect to the insulating compound 225 located in the cover 222. Layer 220 may not only be chemically inert to ambient materials but be chemically inert to ambient materials and electrically conductive.

Figure 11:
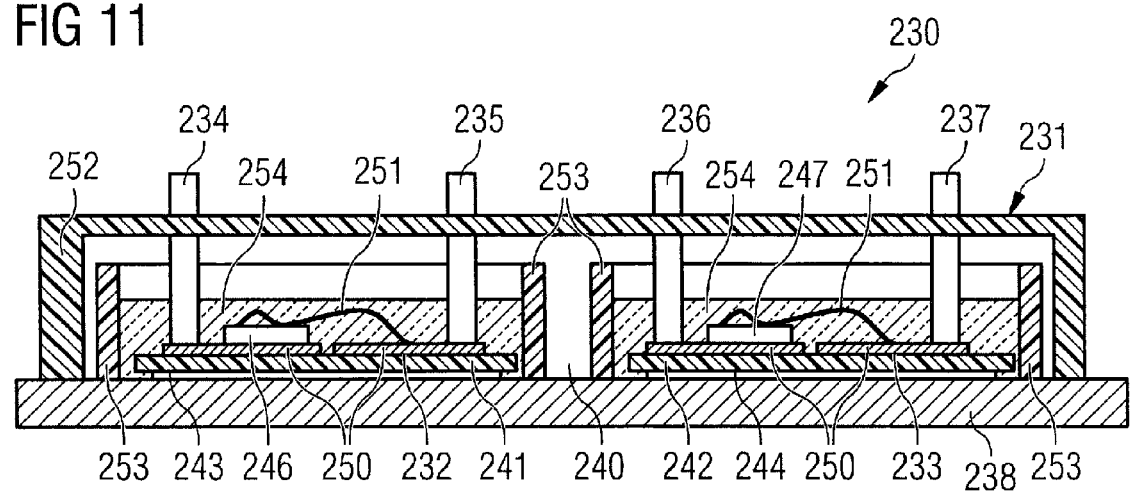
FIG. 11 is cross sectional view of a tenth novel power module.

FIG. 11 shows a cross section of a tenth exemplary power semiconductor module 230. The power module 230 comprises a housing 231, substrates 232 and 233, contact pins 234, 235, 236, and 237, and a base plate 238. The housing 231 is arranged above the substrates 232 and 233 and the substrates 232 and 233 are located on the base plate 238. The contact pins 234, 235, 236, and 237 are disposed on the substrates 232 and 233.

The substrate 232 is separated from the adjacent substrate 233 by a space 240. The substrates 232 and 233 include upper surfaces 241 and 242, and lower surfaces 243 and 244. The lower surfaces 243 and 244 are connected to the base plate 238 via a solder or thermally conductive glue. The upper surfaces 241 and 242 are connected to semiconductor chips 246 and 247 by a plurality of conductive paths 250, which are arranged on the upper surfaces 241 and 242 of the substrates 232 and 233. A plurality of bonding wires 251 is electrically connects the semiconductor chips 246 and 247 to the conductive tracks 250.

The housing 231 is closed with respect to its environment. The housing 231 includes a cover 252 and a plurality of walls 253. The cover 252 surrounds the walls 253, the substrates 232 and 233, and the semiconductor chips 246 and 247.

Bottom ends of the walls 253 are connected to the base plate 238 and top ends of the walls 253 are separated from the cover 252. The walls 253 are joined to the base plate 238 to form a first enclosure around the substrate 232 and semiconductor chip 246, and a second enclosure around the substrate 232 and semiconductor chip 247.

The contact pins 234, 235, 236, and 237 are disposed on the substrates 232 and 233, and are electrically attached to the conductive paths 250. First ends of the contact pins 234, 235, 236, and 237 are attached to the substrates 232 and 233 and second ends of the contact pins 234, 235, 236, and 237 protrude the cover 252 to the exterior of the power module 230. Creepage distances between the contact pins 234, 235, 236, and 237, and between the contact pins 234, 235, 236, and 237 and the base plate 238 are formed on the cover 252.

An encapsulating compound 254 may be filled into the enclosures, covering the semiconductor chips 246 and 247, the substrates 232 and 233, and the bonding wires 251.

The cover 252 is a form of protective coating. The power module 230 is closed with respect to its environment. The walls 253 comprise materials, which are thermally insulating and mechanically compatible with the base plate 238, the encapsulating compound 254, and the substrate 232. The cover 252 comprises a shielding material of high resistance to surface tracking. The creepage distances between the contact pins 234, 235, 236, and 237 and the base plate 238, and between the contact pins 234, 235, 236, and 237 are formed on the cover 252. The formation of creepage distances on the cover 252 provides is advantageous in that the cover 252 comprises a material of high resistance to surface tracking.

Figure 12:
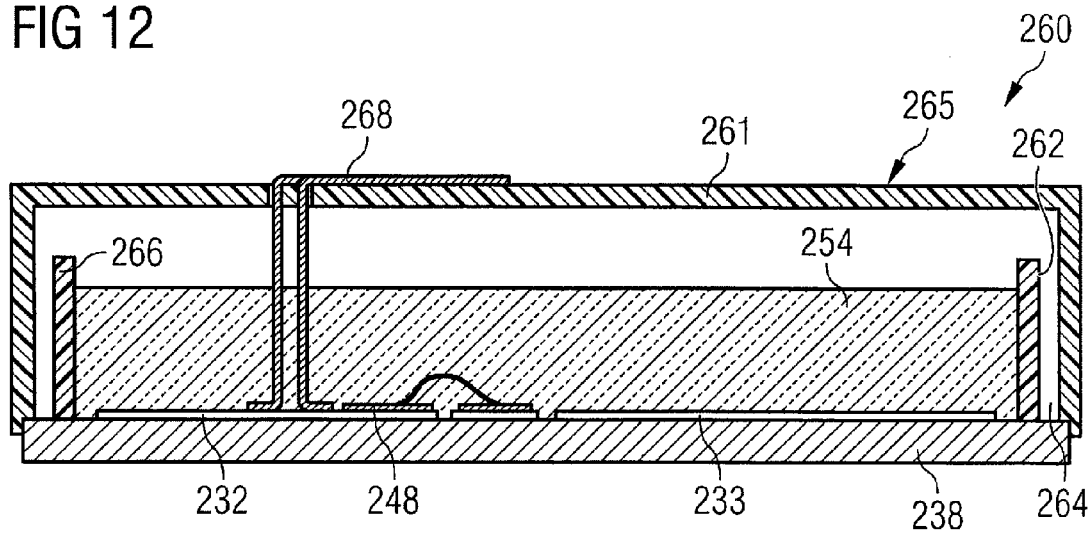
FIG. 12 is cross sectional view of an eleventh novel power module.

FIG. 12 shows a cross section of an eleventh exemplary power module 260. The power module 260 comprises a housing 265, substrates 232 and 233, semiconductor devices 248, contact pins 268, and a heat sink 238. The heat sink 238 may be a base plate. The substrates 232, 233 may be DCB (Direct Copper Bonding) substrate, an Active Metal Brazing (AMB) substrate, a Direct Aluminum Bonding (DAB) substrate or a regular brazing type substrate. The substrates 232 and 233 are located on the heat sink 238, the semiconductor devices 248 are arranged onto and contacted to the substrates 232, 233, and the housing 231 is placed above the substrates 232, 233 and semiconductor devices 246. The contact pins 268, which may be main contacts or auxiliary contacts, are disposed on and contacted to the substrate 232 and protrude the housing 265 to the exterior of the power module 260.

The housing 265 comprises a cover 261 and a casing. The casing is a plurality of walls 262. The cover 261, which may be moulded, surrounds the walls 262, the substrates 232 and 233, and the semiconductor devices 248 and encapsulates the power module 260. The plurality of walls 262 form a frame 266 which is bonded at the sides of the walls 262 facing the heat sink 238 to the heat sink 238. The frame 266 may be bonded to the heat sink 238 by metalizing the sides of the walls 262 facing the heat sink 238 and soldering the frame 266 to the heat sink 238. The soldering of the frame 266 may be done simultaneously with the soldering of the substrates 232, 233 onto the heat sink 238. Thus, the frame 266 may serve as a soldering form for the substrates 232, 233.

The frame 266 forms an enclosure, which surrounds the substrates 232, 233. The enclosure is filled with an insulating compound 254 which covers the substrates 232, 233 and the semiconductor devices 248. Compound 248 may be a resin or a silicon gel. Frame 266 is physically separated from the cover 261 by a gap 264. Only the frame is filled with the compound 254 and there is no compound 254 within the gap 264.

While the cover 261 may be made from a material of high resistance to surface tracking or include sections of high resistance to surface tracking, the frame 266 is made from an insulating material. The insulating material for the frame 266 may comprise a ceramic which is chemically inert with respect to the compound 254 and the semiconductor devices 248 mounted on the substrates 232 and 233 and surrounded by the frame 266.

The compound 254 is only within the frame 266 without being in contact with the cover 261. The separation of the compound from the cover 261 is ensured by the frame 266 and the gap 264. Detrimental interactions between the cover 261 and the compound 254 are thus avoided.

Figure 13:
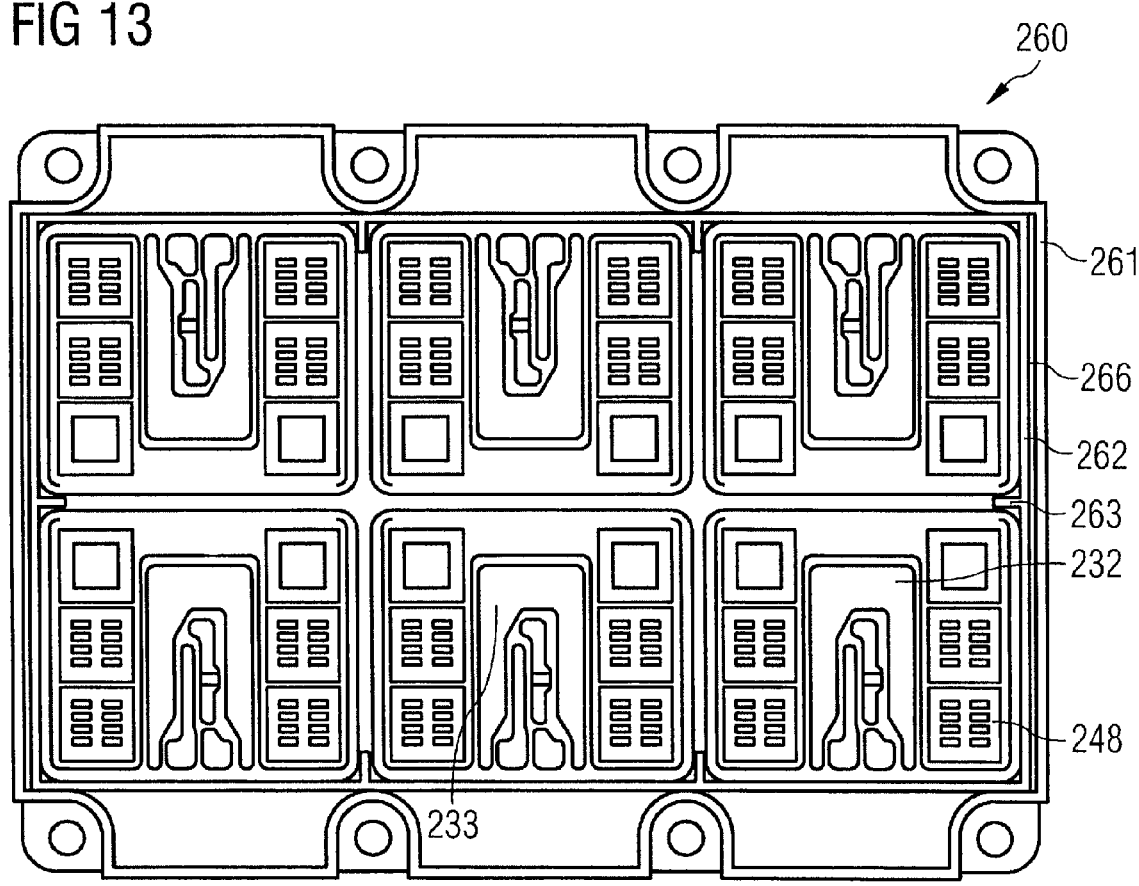
FIG. 13 is top view of the power module shown in FIG. 12.

FIG. 13 shows the power module 260 in a top view. Several substrates 232, 233 are enclosed by the frame 266. The frame 266 lines with the outer edges of the substrates 232, 233. The frame 266 is shown in FIG. 13 in a rectangular shape. Other shapes of the frame 266 are possible depending on the shape of the at least one substrate 232, 233 and the shape of the cover 261. The frame 266 has flanges 263 along the walls 262 extending into the space between the substrates 232, 233. The flanges 263 position the substrates 232, 233 and the frame 266 may be used as a positioner during soldering of the substrates.

In the above-mentioned examples, the minimum thickness of the outer insulating layer of a module housing having a high resistance to surface tracking is limited by a given manufacturing method. A typical ratio of the thickness of the inner insulation layer of a module housing and the thickness of the outer insulation layer of a module housing may range from 10:1 to 50:1. The thickness of the outer layer of high resistance to surface tracking can be enlarged by providing ribs or grooves on its surface. The ratio of thickness of the inner layer and the outer layer may then range from 1:1 to 50:1.

Provision of the outer insulating layer of high resistance to surface tracking is also possible by a lacquer coating process as discussed above. From producing printed circuit boards there are lacquers known which comprise high resistance to surface tracking. These lacquers can be applied in the above-mentioned examples. Such coatings of high resistance to surface tracking can be provided on a housing after producing the housing. The ratio of layer thickness between the inner layer and the outer layer of a module housing are then between 1000:1 until 10:1.

In a further example, the housing body is produced with the desired insulation material of high resistance to surface tracking as a stand-alone layer and is coated subsequently from the inside for providing mechanical and thermal compatibility with the materials used and with semiconductor components.

The ratio of thickness of the inner insulation layer to the outer insulation layer of high resistance to surface tracking is then between 1:10 to 1:1000.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A power semiconductor module comprising a housing wherein the housing comprises:
   a casing and at least one coating of high resistance to surface tracking arranged on an external side of the casing facing away from an interior of the power semiconductor module; and
   a plurality of electrical conductors being provided on the housing in direct contact with the casing, the coating being provided on a creepage distance between the electrical conductors, the creepage distance corresponding to a shortest path between the electrical conductors along a surface of the casing at which the plurality of electrical conductors are in direct contact.

2. The power semiconductor module of claim 1, wherein the coating only partially covers the casing.

3. The power semiconductor module of claim 1, wherein the coating is in contact with or bonded to an external surface of the casing.

4. The power semiconductor module of claim 1, wherein a layer is attached to the casing, the layer being chemically inert with respect to ambient materials.

5. The power semiconductor module of claim 4, wherein the layer is attached to an internal surface of the casing, the layer being chemically inert with respect to an insulating compound located in the casing.

6. The power semiconductor module of claim 1, wherein a layer is attached to an internal surface of the casing, the layer being chemically inert to ambient materials and electrically conductive.

7. The power semiconductor module of claim 1, wherein the coating and the casing are physically separate parts.

8. The power semiconductor module of claim 1, wherein the electrical conductors comprise one or more heat sinks, one or more electrical terminals, one or more main high voltage contacts and/or one or more auxiliary contacts.

9. The power semiconductor module of claim 1, wherein the module comprises a base plate, the housing is mounted on a first surface of the base plate, at least one substrate is mounted on the first surface of the base plate and is positioned within the housing, and at least one semiconductor chip is mounted on the substrate.

10. The power semiconductor module of claim 1, wherein the coating comprises a first surface and a second surface, the second surface being located opposite to the first surface.

11. The power semiconductor module of claim 10, wherein the coating comprises protrusions on the first surface of the coating, the first surface of the coating being provided on the creepage distance between the electrical conductors.

12. The power semiconductor module of claim 11, wherein the second surface of the coating is in contact with an exterior surface of the casing where the second surface of the coating comprises a plurality of first grooves interlocked with a plurality of second grooves of the exterior surface of the casing.

13. The power semiconductor module of claim 1, wherein the coating comprises a layer formed by a plastics injection moulding process.

14. The power semiconductor module of claim 7, wherein the casing comprises a plurality of walls bonded onto a base plate or a heat sink and the plurality of walls forms a frame surrounding at least one substrate disposed on the base plate or a heat sink, the frame having at least one flange which extends into a space between substrates.

15. The power semiconductor module of claim 7, wherein the casing comprises a plurality of walls bonded onto a base plate or a heat sink and the plurality of walls forms a frame surrounding at least one substrate disposed on the base plate or a heat sink, the frame being made from an insulating material comprising a ceramic.

16. The power semiconductor module of claim 7, wherein the casing comprises a plurality of walls bonded onto a base plate or a heat sink, the plurality of walls forms a frame surrounding at least one substrate disposed on the base plate or a heat sink, the frame forms an enclosure filled with an insulating compound and the insulating compound comprises a silicon gel.

17. The power semiconductor module of claim 7, wherein the casing comprises a plurality of walls bonded onto a base plate or a heat sink, the plurality of walls forms a frame surrounding at least one substrate disposed on the base plate or a heat sink, the frame forms an enclosure filled with an insulating compound and the insulating material for the frame is chemically inert with respect to the insulating compound and to a semiconductor chip mounted on the substrate and surrounded by the frame.

18. A method for producing a power semiconductor module, comprising:
   providing a housing;
   providing a plurality of electrical conductors on the housing;
   providing at least one coating of high resistance to surface tracking on a creepage distance between the electrical conductors, the coating being arranged on an external side of the housing facing away from an interior of the power semiconductor module, the creepage distance corresponding to a shortest path between the electrical conductors along a surface of the housing at which the plurality of electrical conductors are in direct contact.

19. The method of claim 18, wherein providing the at least one coating comprises providing the at least one coating before the electrical conductors are provided on the housing.

20. The method of claim 18, wherein providing the at least one coating comprises providing the at least one coating after the electrical conductors are provided on the housing.

21. A method for producing a power semiconductor module, comprising:
   providing a housing;
   providing a plurality of electrical conductors on the housing; and
   partly covering an external side of the housing facing away from an interior of the power semiconductor module with a coating susceptible to surface tracking on a creepage distance between the electrical conductors, the creepage distance corresponding to a shortest path between the electrical conductors along a surface of the housing at which the plurality of electrical conductors are in direct contact.

22. The method of claim 21, wherein partly covering the external side of the housing with the coating comprises partly covering the external side of the housing with the coating before the electrical conductors are provided on the housing.

23. The method of claim 21, wherein partly covering the external side of the housing with the coating comprises partly covering the external side of the housing with the coating after the electrical conductors are provided on the housing.

* * * * *